(12) United States Patent
Condie et al.

(10) Patent No.: US 7,435,625 B2
(45) Date of Patent: Oct. 14, 2008

(54) SEMICONDUCTOR DEVICE WITH REDUCED PACKAGE CROSS-TALK AND LOSS

(75) Inventors: Brian W. Condie, Mesa, AZ (US); Mali Mahalingam, Scottsdale, AZ (US); Mahesh K. Shah, Scottsdale, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 8 days.

(21) Appl. No.: 11/257,802

(22) Filed: Oct. 24, 2005

(65) Prior Publication Data

US 2007/0090542 A1    Apr. 26, 2007

(51) Int. Cl.
*H01L 21/00* (2006.01)

(52) U.S. Cl. ............... 438/124; 438/106; 438/112; 438/126; 438/FOR. 367; 257/E23.126; 257/787; 257/789; 257/790; 174/52.2; 174/52.4

(58) Field of Classification Search ........... 257/787, 257/E23.119, E23.126, E23.092, E23.121, 257/789, 790, 795, 796, 728; 438/112, 124, 438/127, 106, 118, 123, 126, FOR. 367, FOR. 379; 437/207, 219; 174/559, 52.2, 52.4
See application file for complete search history.

(56) References Cited

U.S. PATENT DOCUMENTS

| 4,041,009 | A | * | 8/1977 | Takeda et al. ............ 524/425 |
| 4,079,162 | A | * | 3/1978 | Metzger .................. 523/219 |
| 4,788,583 | A | * | 11/1988 | Kawahara et al. .......... 257/670 |
| 5,057,457 | A | * | 10/1991 | Miyahara et al. ........ 264/272.14 |
| 5,097,317 | A | * | 3/1992 | Fujimoto et al. ........... 257/786 |
| 5,379,186 | A | * | 1/1995 | Gold et al. ............... 361/706 |
| 5,382,829 | A | * | 1/1995 | Inoue ..................... 257/659 |
| 5,446,315 | A | * | 8/1995 | Hazaki et al. ............. 257/687 |

(Continued)

FOREIGN PATENT DOCUMENTS

JP          09027573 A    *   1/1997

OTHER PUBLICATIONS

Prassas, Michael, Silica Glass from Aerogels, Sol-Gel Gateway: Glass from Aerogels, http://www.solgel.com/articles/april01/aerog2.htm and http://www.solgel.com/articles/april01.aerog.htm.

(Continued)

*Primary Examiner*—Chris C. Chu
(74) *Attorney, Agent, or Firm*—Ingrassia, Fisher & Lorenz, P.C.

(57) ABSTRACT

Structure and method are provided for plastic encapsulated semiconductor devices having reduced package cross-talk and loss. Semiconductor die are first coated with a buffer region having a lower dielectric constant $\epsilon$ and/or lower loss tangent $\delta$ than the plastic encapsulation. The encapsulation surrounds the buffer region providing a solid structure. The lower $\epsilon$ buffer region reduces the stray capacitance and therefore the cross-talk between electrodes on or coupled to the die. The lower $\delta$ buffer region reduces the parasitic loss in the encapsulation. Low $\epsilon$ and/or $\delta$ buffer regions can be achieved using low density organic and/or inorganic materials. Another way is to disperse hollow microspheres or other fillers in the buffer region. An optional sealing layer formed between the buffer region and the encapsulation can mitigate any buffer layer porosity. The buffer region desirably has $\epsilon$ less than about 3.0 and/or $\delta$ less than about 0.005.

12 Claims, 4 Drawing Sheets

U.S. PATENT DOCUMENTS

| | | | |
|---|---|---|---|
| 5,458,709 A | | 10/1995 | Kamezaki et al. |
| 5,578,860 A | | 11/1996 | Costa et al. |
| 5,593,526 A | | 1/1997 | Yokouchi et al. |
| 5,598,034 A | | 1/1997 | Wakefield |
| 5,785,789 A | * | 7/1998 | Gagnon et al. ............ 156/235 |
| 5,793,118 A | * | 8/1998 | Nakajima ................ 257/790 |
| 5,869,355 A | * | 2/1999 | Fukaya .................... 438/123 |
| 5,889,232 A | * | 3/1999 | Ichikawa et al. .......... 174/524 |
| 6,001,673 A | | 12/1999 | Marcinkiewicz |
| 6,191,492 B1 | * | 2/2001 | Yamazaki et al. ......... 257/787 |
| 6,440,772 B1 | * | 8/2002 | Smith ...................... 438/106 |
| 6,455,606 B1 | * | 9/2002 | Kaku et al. ............... 521/170 |
| 6,521,703 B2 | * | 2/2003 | Zarnoch et al. ............ 525/17 |
| 6,630,153 B2 | * | 10/2003 | Long et al. ................ 424/422 |
| 6,713,590 B2 | | 3/2004 | Lau et al. |
| 6,744,117 B2 | | 6/2004 | Dragon et al. |
| 6,794,481 B2 | | 9/2004 | Amagai et al. |
| 6,849,696 B2 | | 2/2005 | Lau et al. |
| 6,890,641 B1 | | 5/2005 | Mukherjee et al. |
| 2002/0033108 A1 | * | 3/2002 | Akiyama et al. ........... 101/457 |
| 2003/0130438 A1 | * | 7/2003 | Amagai et al. ............ 525/370 |

OTHER PUBLICATIONS

Simmonds, M. et al., SiLK Semiconductor Dielectric Resin Films, technical paper, Dow Chemical Company, pp. 1-7.

Dow Unveils Advanced SiLK Resin Featuring Drastically Smaller Pore Size, Introduces First Porous ILD to Enable Continuous Tantalum Barriers, Dow Chemical Company, Dec. 25, 2003, http://www.dow.com/silk/news/20030918b.htm.

Perry, J. et al., SiLK Semiconductor Dielectric Resins, technical paper, Dow Chemical Company, pp. 1-6.

SiLK Works, Dow Chemical Company, http://www.dow.com/silk/index.htm.

Physical Sciences—Sol Gel Introduction, http://www.bell-labs.com/org/physicalsciences/projects/solgel/solgel.html.

Sol-Gel Technologies, Sol-Gel Improves the quality of Human Life, http://www.sol-gel.com/technology.html.

Phalippou, Jean, Sol-Gel: A Low Temperature Process for the Materials of the New Millenium, Sol-Gel Tutorial, http://www.solgel.com/articles/June00/phalip/introsolgel.htm.

Peters, Laura, Is Pore Sealing Key to Ultralow-k Adoption?, Semiconductor International, Oct. 1, 2005, http://www.reed-electronics.com/semiconductor/article/CA6260716?industryid=3032&nid=2012.

International Search Report and Written Opinion.

* cited by examiner

SEMICONDUCTOR DEVICE WITH REDUCED PACKAGE CROSS-TALK AND LOSS

The present invention generally relates to semiconductor devices, and more particularly to plastic encapsulated semiconductor devices with lower package cross-talk and loss.

BACKGROUND

Semiconductor (SC) devices are often encapsulated in molded plastic. The molded plastic surrounds and protects the semiconductor die, supports the bonding wires and external leads and imparts ruggedness and shock resistance to the device. Plastic packaged devices are widely used. FIG. 1 shows a simplified schematic cross-sectional view through prior art molded plastic package 20 containing semiconductor (SC) die 22. SC die 22 is conveniently but not essentially mounted on heatsink 23. Metal contact regions 24-1, 24-2 (collectively 24) are provided on SC die 22 to which external leads 26-1, 26-2 (collectively 26) are coupled by wire bonds or other means 25-1, 25-2 (collectively 25). Plastic encapsulant 27 is molded around SC die 22, wire bonds 25 and inner portions 28-1, 28-2 (collectively 28) of external leads 26, so that, in this example, lower surface 21 of heatsink 23 remains exposed on the lower face of package 20, but having surface 21 exposed is not essential. While plastic encapsulation, such as is illustrated in FIG. 1 and equivalents, is widely used, it suffers from a number of disadvantages and limitations well known in the art. Among these are that plastic material 27 surrounding SC die 22 and leads 25 and 28 has a significantly higher dielectric constant $\epsilon$ and loss tangent $\delta$ than does air or vacuum. For example, commonly used plastic encapsulants for semiconductor devices often have relative dielectric constants $\epsilon$ in the range 3.5 to 5.0 and loss tangents $\delta$ in the range 0.005 to 0.015 at the operating frequencies of interest. These are sufficient to result in significant degradation of performance, especially at high frequencies and high voltages, from electrical cross-talk through the plastic encapsulation between the various die metal regions, bonding wires and other leads, due to fringing electric field 29 extending into surrounding plastic encapsulant 27. The capacitive coupling and loss associated with fringing electric field 29 increase as the dielectric constant $\epsilon$ and loss tangent $\delta$ of encapsulant 27 increase.

In the prior art, the capacitive coupling and loss associated with this fringing electric field extending outside of the SC die has been mitigated or avoided by, for example: (i) using a Faraday shield (not shown) over the die and/or wire bonds, and/or (ii) using hollow ceramic and/or metal packages that provide an air or vacuum space above the die surface and around the wire bonds and inner package leads. A Faraday shield constrains the fringing fields but at the cost of additional die complexity due to the additional metal and masking layers required. A vacuum or airspace package is illustrated in FIG. 2, which shows hollow package 30 having air or vacuum space 37 surrounding die 32. Die 32 is mounted on, for example, metal, ceramic or plastic base 33 to which are attached external leads 36-1, 36-2 (collectively 36). Wire bonds or other connections 35-1, 35-2 (collectively 35) couple bonding pads 34-1, 34-2 (collectively 34) on die 32 to inner portions 38-1, 38-2 (collectively 38) of package leads 36-1, 36-2 (collectively 36). Cap 31 is placed over substrate 34, die 32, wire bonds or other connections 35 and inner portions 38 of package leads 36. Having air or vacuum space 37 around die 32 and leads 35, 38 means that fringing electric field 39 is not in contact with any encapsulant. Therefore there is no increase in coupling capacitance and/or loss caused by a plastic encapsulant in contact with the die surface and wire bonds and/or inner leads. The dielectric constant $\epsilon_0$ and loss tangent $\delta_o$ of air or vacuum are low and so cross-talk and dielectric loss are minimized. However, such air or vacuum cavity packages are significantly more expensive and often not as rugged as plastic encapsulation. Wire bonds or other connections 35 can become detached if the finished device is subjected to large acceleration forces.

Thus, there continues to be a need for improved semiconductor devices and methods that provide plastic encapsulated devices with reduced cross-talk and loss. Accordingly, it is desirable to provide improved semiconductor devices with plastic encapsulation having lower dielectric constant $\epsilon$ and/or the loss tangent $\delta$ material in contact with some or all of the die surface, die leads and/or bonding wires. In addition, it is desirable that the improved plastic encapsulation materials, structures and methods allow a substantially solid structure to be formed surrounding the semiconductor die, die leads and bonding wires so as to provide a mechanically rugged package. It is further desirable that the improved devices be achieved using fabrication technology already available on or easily added to a typical semiconductor device manufacturing line so that only minor modification of the manufacturing process is required. Other desirable features and characteristics of the invention will become apparent from the subsequent detailed description and the appended claims, taken in conjunction with the accompanying drawings and the foregoing technical field and background.

BRIEF DESCRIPTION OF THE DRAWINGS

The invention will hereinafter be described in conjunction with the following drawing figures, wherein like numerals denote like elements.

DETAILED DESCRIPTION

Figure 1:
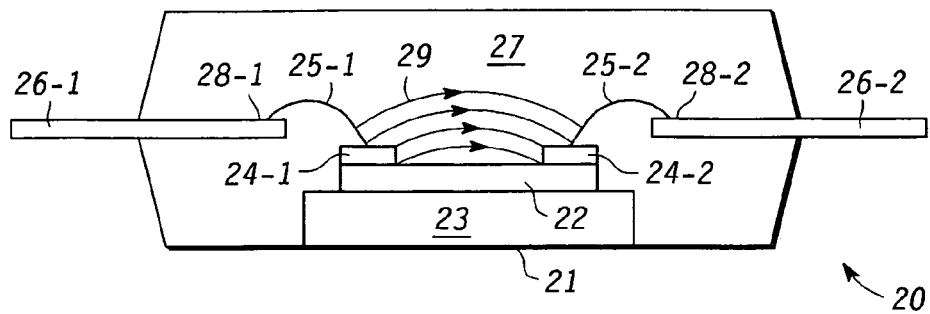
FIG. 1 shows a simplified schematic cross-sectional view through a prior art molded plastic packaged device containing a semiconductor (SC) die.
Figure 2:
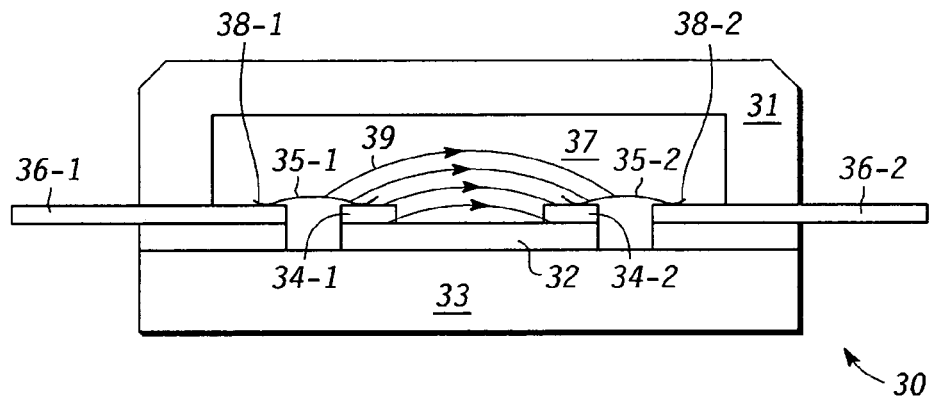
FIG. 2 shows a simplified schematic cross-sectional view through a prior art hollow package device containing a semiconductor (SC) die.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus.

The terms "left," "right," "in," "out," "front," "back," "up," "down," "top," "bottom," "over," "under," "above," "below" and the like in the description and the claims, if any, are used for descriptive purposes and not necessarily for describing permanent relative positions. It is to be understood that the terms so used are interchangeable under appropriate circumstances such that embodiments of the invention described herein are, for example, capable of operation in other orientations than those illustrated or otherwise described herein. The term "coupled," as used herein, is defined as directly or indirectly connected in an electrical or non-electrical manner. As used herein, the term "lead-frame" is intended to include any supporting structure on which one or more individual or interconnected semiconductor die may be mounted, and may be metal, plastic ceramic, glass or combinations thereof. As used herein, the terms "semiconductor die" and abbreviation "SC die" are intended to include semiconductor devices of any sort and configuration, whether individual devices or complex assemblies of devices such as in integrated circuits, or any other configuration of semiconductor devices. As used herein the terms "wire bonds" and "bonding wires" are intended to include any means of electrically coupling package leads to contact regions and/or bonding pads on the SC die and not be limited merely to use of wires or the like. Non-limiting examples of other electrical coupling means are beam leads, solder bumps, metalized plastic tapes, and so forth.

Figure 3:
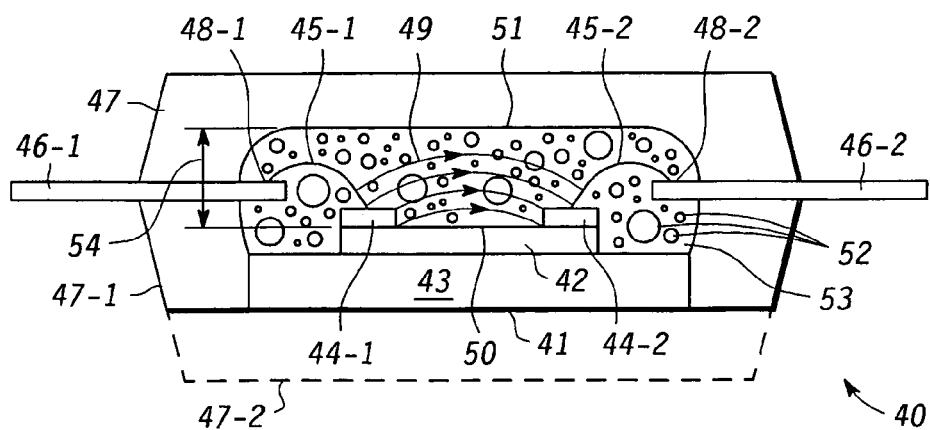
FIG. 3 shows a simplified schematic cross-sectional view through a molded plastic packaged device containing a semiconductor (SC) die, according to a first embodiment of the present invention.
Figure 4:
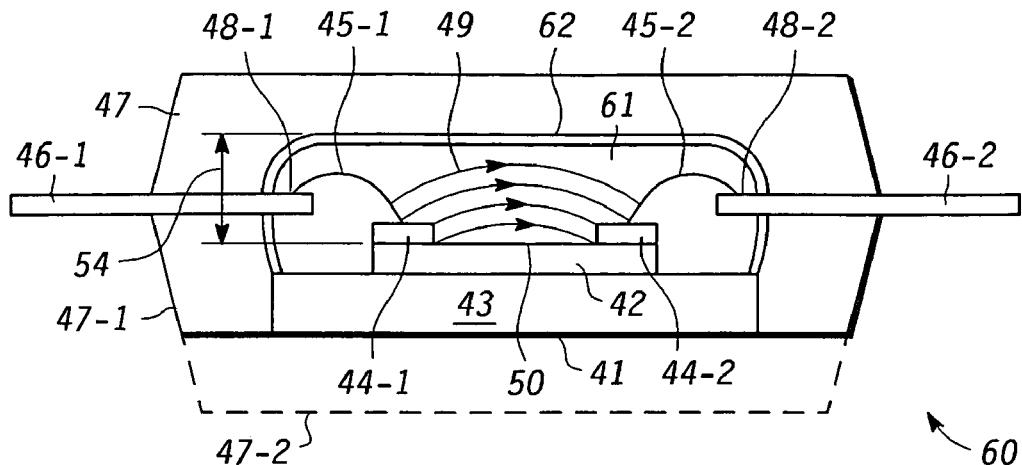
FIG. 4 shows a simplified schematic cross-sectional view through a molded plastic packaged device containing a semiconductor (SC) die, according to a further embodiment of the present invention.
Figure 5:
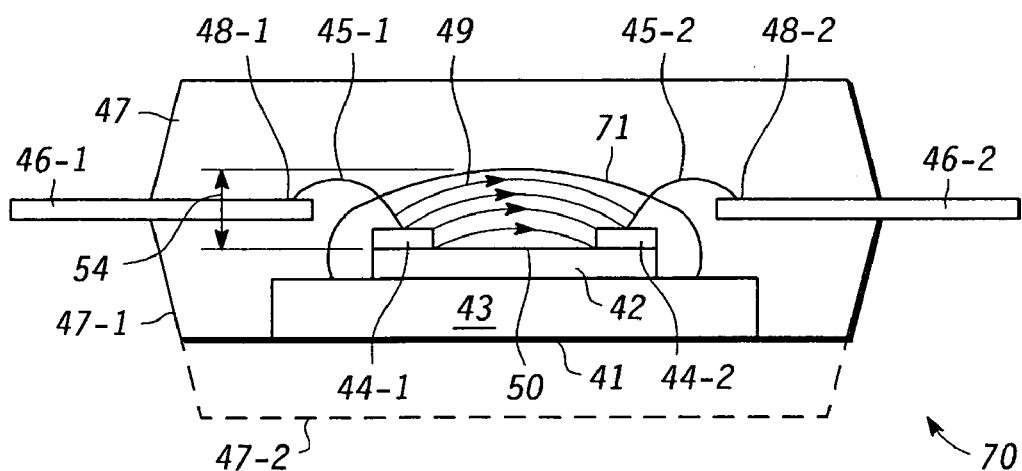
FIG. 5 shows a simplified schematic cross-sectional view through a molded plastic packaged device containing a semiconductor (SC) die, according to a still further embodiment of the present invention.

FIG. 3 shows a simplified schematic cross-sectional view through molded plastic packaged device 40 containing semiconductor (SC) die 42, according to a first embodiment of the present invention. Device 40 comprises SC die or device 42 conveniently but not essentially mounted on heat sink 43 and surrounded (except perhaps for lower surface 41 of heat sink 43) by plastic encapsulation 47. Plastic encapsulation 47 may be such that lower surface 41 of heat sink 43 is exposed as indicated by outline 47-1, or lower surface 41 may be embedded within plastic encapsulation 47 as indicated by outline 47-2. Either arrangement for lower surface 41 is useful and not important to the present invention. However, upper surface 50 of die 42 and its immediate surroundings are separated from encapsulation 47 by buffer region 51 having lower dielectric constant and/or lower loss tangent than encapsulation 47. When buffer region 51 has lower dielectric constant than encapsulation 47, the stray field capacitive coupling is reduced and performance enhanced. When buffer region 51 has lower loss tangent than encapsulation 47, then stray field power loss is reduced and performance enhanced. While it is desirable that both the dielectric constant and the loss tangent of buffer region 51 be less than those of encapsulation 47, this is not essential and improved performance can be obtained when either one is less than that of encapsulation 47. Die 42 has bonding or other connection pads or metalized regions 44-1, 44-2 (collectively 44) on upper surface 50 of die 42. Wire bonds or other connections 45-1, 45-2 (collectively 45) couple connection pads 44 to inner portions 48-1, 48-2 (collectively 48) of external leads 46-1, 46-2 (collectively 46), in order to provide external electrical coupling to die 42. Elements 41, 42, 43, 44, 45, 46 and 48 are analogous in function to elements 21, 22, 23, 24, 25, 26 and 28 of device 20. Fringing electric field 49 of device 40 passes substantially through buffer region 51. While stray fringing electric field 49 is shown in FIGS. 3-5 as extending between die bonding pads 44-1, 44-2 having different electrical potential when device 40 is energized, this is merely for convenience of illustration and persons of skill in the art will understand that stray fringing fields can also extend above the surface of die 42 between other conductive regions, e.g., metal lines on die 42 (not shown), that receive different electrical potentials when used, and that all such stray fringing fields can contribute to the performance degradation described above that is mitigated by the present invention. Devices 40 and 20 differ in that encapsulant 47 of device 40 is substantially not in contact with die 42 which, other than its lower surface where it is bonded to heat sink 43, is enclosed in buffer region 51. Region 51 may be limited substantially to the immediate vicinity of die surface 50 (e.g., see FIG. 5) or may, as shown in FIGS. 3-4, also enclose all or some parts of wire bonds or connections 45 and inner ends 48 of leads 46. Either arrangement is useful.

Buffer region 51 needs to be chemically stable and electrically and chemically compatible with surface 50 of SC die 42 so as to not upset the operation of SC die 42. FIG. 3 illustrates the situation where buffer region 51 has therein, for example, a significant amount of filler 52 having a lower dielectric constant and/or loss tangent than binder or resin 53 that makes up the remainder of buffer region 51. This has the effect of lowering the overall dielectric constant $\epsilon$ and/or loss tangent $\delta$ of region 51 relative to encapsulation 47. It is important that buffer region 51 be generally in contact with or in close proximity to device surface 50, e.g., where metal pads or traces 44 are located, and also desirably but not essentially to wire bonds 45 and inner portions 48 of external leads 46, so as to have the maximum beneficial effect of lowering the overall dielectric constant $\epsilon$ and/or loss tangent $\delta$ in these locations where fringing field 49 is strongest.

A variety of low dielectric constant and/or low loss fillers 52 are suitable for inclusion in buffer region 51. In general filler 52 should be chemically stable, compatible with binder resin 53 used in region 51 and the molding process, and available in a variety of generally microscopic sizes so as to facilitate a substantially uniform but generally random size distribution throughout region 51. Further, it is desirable that adding filler 52 not result in a significant increase in the external porosity of region 51 or device 40. It is desirable that a mix of filler sizes be used so that filler 52 can be tightly packed within binder resin 53 to fill as much space as possible (thereby minimizing the dielectric constant and/or loss tangent of the composite making up buffer region 51) with minimum impact on the overall package strength and hermeticity. Useful materials are finely divided styrene and other lightweight plastics and glasses, and glass or ceramic fragments or hollow glass, ceramic or plastic microspheres, or combinations thereof. Hollow glass microspheres are a non-limiting example of a desirable filler material and are commercially available, for example, from the 3M Company of St. Paul, Minn. in a suitable range of sizes. It is desirable that the hollow microspheres or other low density particles have lower sizes of the order of typical device feature sizes (e.g., a few micrometers), and maximum sizes that are, for example, not larger than about 50% percent of thickness 54 of region 51. The upper size limit is desirable to avoid having a fracture of one or more large microspheres cause an undesirable weak point or break in region 51 that might allow moisture to enter. It is desirable that the microspheres or other particles be about ≦300 micro-meters, more conveniently about ≦100 micro-meters and preferably about ≦80 micro-meters in diameter or largest dimension. Stated another way, it is desirable that the microspheres or other filler particles have a size range of usefully about 0.3 to 300 micro-meters, more conveniently about 3 to 100 micrometers and preferably about 3 to 80 micro-meters, but larger or smaller ranges can also be used, depending upon the particular devices being encapsulated, the size and construction of the lead-frame, the type of filler being used and so forth. The amount of hollow microspheres (or other filler) in the mix should be as large as possible consistent with maintaining sufficient robustness and moisture resistance. In general, the volume percentage of microspheres or other filler particles in region 51 should be usefully equal or greater than about 50 volume percent, more conveniently equal or greater than about 60 volume percent and preferably equal or greater than about 70 volume percent in the mix or composite making up buffer region 51.

FIG. 4 shows a simplified schematic cross-sectional view through molded plastic packaged device 60 containing semiconductor (SC) die 42, according to a further embodiment of the present invention. Elements 41, 42, 43, 44, 45, 46, 47, 47-1, 47-2 and 48 of device 60 are analogous to similarly identified elements in device 40, and the description thereof in connection with device 40 is incorporated herein by reference. Devices 40 and 60 differ in the constitution of buffer regions 51, 61 around die 42. Device 40 illustrates the use of a low dielectric constant buffer region 51 containing filler 52. Device 60 illustrates the use of substantially homogeneous buffer region 61 providing a lower dielectric constant and/or lower loss tangent than encapsulation 47. When buffer region 61 has lower dielectric constant than encapsulation 47, the stray field capacitive coupling is reduced and performance enhanced. When buffer region 61 has lower loss tangent than encapsulation 47, then stray field power loss is reduced and performance enhanced. While it is desirable that both the dielectric constant and the loss tangent of buffer region 61 be less than those of encapsulation 47, this is not essential and improved performance can be obtained when either one is less than that of encapsulation 47. Buffer region 61 needs to be chemically stable and electrically and chemically compatible with surface 50 of SC die 42 so as to not upset the operation of SC die 42. Examples of suitable materials are polyimide materials available from, Hitachi Company of Tokyo, Japan, Teflon® materials available from DuPont Corporation of Wilmington, Del. and SiLk® materials available from Dow Chemical Company of Midland, Mich. Another example of useful materials are those known as SOL-GELS and/or AERO-GELS. Such materials are generally commercially available and known in the art (e.g., see www-.solgel.com). They can provide substantially inorganic or organic materials or combinations thereof for buffer region 51, 61, 71, 81.

Device 60 of FIG. 4 also illustrates use of optional sealing layer 62 covering buffer region 61. While sealing layer 62 is illustrated only in FIG. 4, it is also applicable to buffer region 51 of FIG. 3, buffer region 71 of FIG. 5 and buffer region 81 of FIGS. 6-7. Accordingly, as used herein, references to buffer region 61 in connection with sealing layer 62 are intended to include buffer regions 51, 71 and 81. Sealing layer 62 is desirable where buffer region 61 might introduce porosity within encapsulation 47. Porosity that might permit easier ingress of moisture or other harmful substances is undesirable. Providing substantially impermeable sealing layer 62 over buffer region 61 can mitigate an increase in porosity introduced by region 61. Non-limiting examples of suitable materials for sealing layer 62 are: substantially inorganic materials such as deposited silicon dioxide and/or silicon nitride, substantially organic materials such as polyimide and/or parylene, and various combinations of inorganic and organic materials. Alternatively, sealing layer 62 can be created in-situ by exposing buffer region 61 (or regions 51, 71 and 81) to a plasma or other catalyst, for example, to promote cross-linking or other chemical reaction to render the surface layer of buffer region 61 (or 51, 71 and 81) substantially impermeable to, for example, moisture. Whether or not sealing layer 62 is needed depends upon the choice of substances for buffer regions 51, 61, 71 and 81 and encapsulation 47, the moisture sensitivity of die 42 and the environmental specifications that the finished encapsulated device is expected meet. These will vary from situation to situation and are within the competence of persons of skill in the art. Persons of skill in the art will understand how to decide whether sealing layer 62 is needed. While the use of sealing layer 62 is specifically illustrated in device 60 of FIG. 4, such a sealing layer can also be used over buffer region 51 of device 40 of FIG. 3, buffer region 71 of device 70 of FIG. 5 and buffer region 81 of FIGS. 6-7, if desired. Further while barrier layer 62 is most useful in protecting against moisture incursion, it is not limited to this purpose and may also be used to retard or mitigate incursion of other harmful substances. Hence the term "sealing layer" is intended to include such functions.

FIG. 5 shows a simplified schematic cross-sectional view through molded plastic packaged device 70 containing semiconductor (SC) die 42, according to a still further embodiment of the present invention. Elements 41, 42, 43, 44, 45, 46, 47, 47-1, 47-2 and 48 of device 70 are analogous to similarly identified elements in devices 40 and 60, and the description thereof in connection with devices 40 and 60 is incorporated herein by reference. Device 40, 60 and 70 differ in thickness 54 of buffer regions 51, 61 and 71. With devices 40 and 60 illustrated in FIGS. 3-4, thickness 54 is sufficient that buffer regions 51, 61 not only cover die surface 50 but extend upward to substantially enclose wire bonds or other connections 45 and, optionally, part of end portions 48 of leads 46. With device 70 of FIG. 5, thickness 54 is smaller so that buffer region 71 (analogous to regions 51, 61, with or without sealing layer 62) covers die surface 50 and die metallization 44, but does not extend sufficiently to enclose all of wire bonds or connections 45. The arrangement of FIG. 5 is suitable where the die and package layout are such that fringing field 79 extends primarily between conductors and/or bonding pads on die surface 50 rather than between wire bonds 45 and lead portions 48. In such situation, a smaller mass of buffer region 71 is sufficient to reduce cross-talk and excessive dielectric loss in packaged device 70. The same materials may be used for region 71 as for regions 51, 61, with or without overlying sealing layer 62 (see FIG. 4). Either arrangement is useful. Accordingly, the discussion of such materials in connection with FIGS. 3-4 is incorporated herein by reference.

Figure 6:
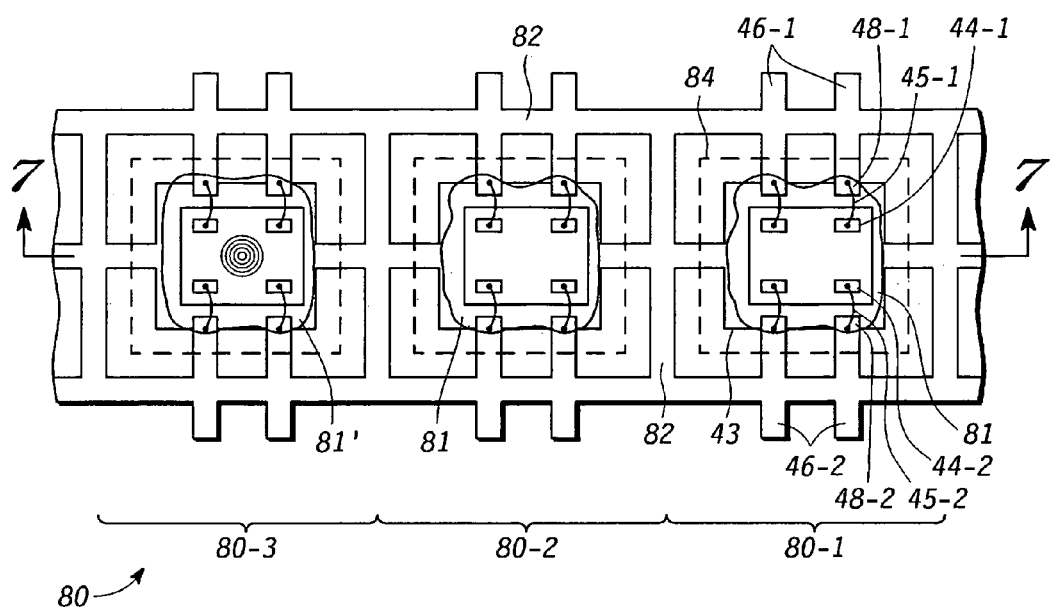
FIG. 6 shows a simplified plan view and FIG. 7 shows a simplified cut-away side view of a lead-frame with a semiconductor (SC) die, illustrating a buffer region being formed on the SC die prior to plastic encapsulation as in FIGS. 3-5.
Figure 7:
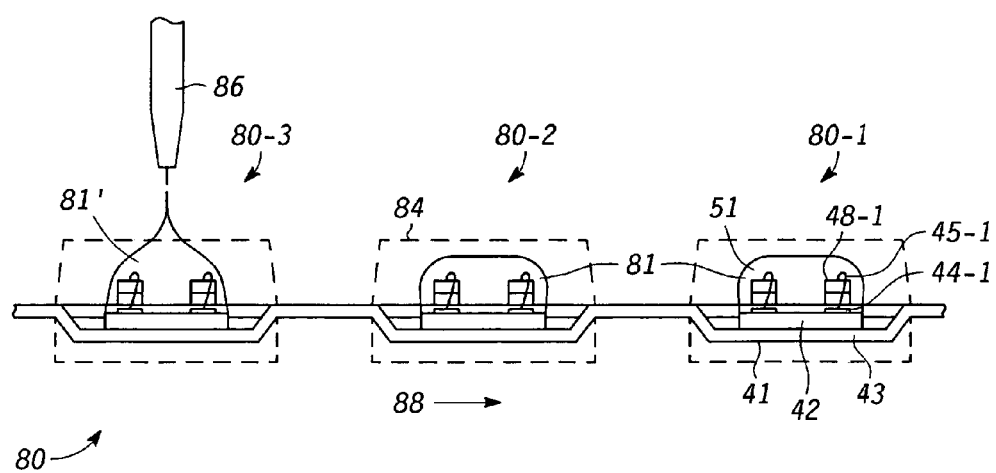

FIG. 6 shows a simplified plan view and FIG. 7 shows a simplified cut-away side view of lead-frame 80 with SC die 42, illustrating buffer region 81 analogous to regions 51, 61, 71 of FIGS. 3-5 being formed on and/or around SC die 42 prior to providing plastic encapsulation 47. Elements 42, 43, 44, 45, 46 and 48 of FIGS. 6-7 are analogous to similarly identified elements in FIGS. 3-5. Three substantially representative sections 80-1, 80-2, 80-3 are illustrated in lead-frame 80, each carrying semiconductor die 42, etc. Dashed outline 84 indicates the approximate location of the mold cavity in which encapsulation 47 is to be formed around die 42, heat sink 43, bonding wires 45, inner lead ends 48, buffer region 81, etc. In this example, lower surface 41 of die bonding flag 43 will be enclosed in encapsulation 47 (see FIGS. 3-5), but this is not essential and it may be left exposed. Lead frame portions 82 are trimmed away after forming encapsulation 47 so that, in this example, all that is left protruding from encapsulation 47 are leads 46. Lead-frame sections 80-1 and 80-2 illustrate buffer region 81 in place on portions 80-1 and 80-2 and having lower dielectric constant and/or lower loss tangent than subsequent encapsulation 47. Buffer regions 81 on lead-frame sections 80-1, 80-2 are either cured or ready to be cured, depending upon the nature of the material making up buffer regions 81, and ready to be enclosed in encapsulation 47 (see FIGS. 3-5). Lead-frame section 80-3 illustrates buffer region 81' just as it is being applied over die 42, etc., from nozzle 86. (Nozzle 86 is omitted from FIG. 6 in order to not obscure the view of underlying die 42.) In this example in FIG. 7, a drop of the material forming buffer region 81' has just been dispensed from nozzle 86 and dropped onto die 42 (and associated parts) where it will collapse to form region 81 shown in sections 80-2 and 80-1. By indexing lead-frame 80 in the direction shown by arrow 88 (or nozzle 86 in the opposite direction), each section 80-1, 80-2, 80-3, . . . 80-N of lead-frame 80 is brought under nozzle 86 so that buffer region 81 may be applied as desired. By using multiple nozzles (either in parallel or series), multiple die may be simultaneously coated with buffer region 81, so that the process can be highly automated and inexpensively performed. Where a sealing layer, e.g., analogous to layer 62 of FIG. 4, is desired, it may be applied over buffer region 81 in substantially the same manner, or sprayed on buffer region 81, formed in situ or by any other convenient means, as has already been discussed.

It is desirable that low dielectric constant buffer region 51, 61, 71, 81 has a dielectric constant that is usefully about ≦80 percent of the dielectric constant of encapsulation 47, more conveniently about ≦60 percent and preferably about ≦40 percent of encapsulation 47. Stated in another manner, it is desirable that buffer region 51, 61, 71, 81 usefully has a relative dielectric constant of less than about 3.0, more conveniently less than about 2.5 and preferably less than about 2.0, and in any case less than the dielectric constant of encapsulation 47. Similarly, the loss tangent of buffer region 51, 61, 71, 81 is desirably less than about 0.005.

Figure 8:
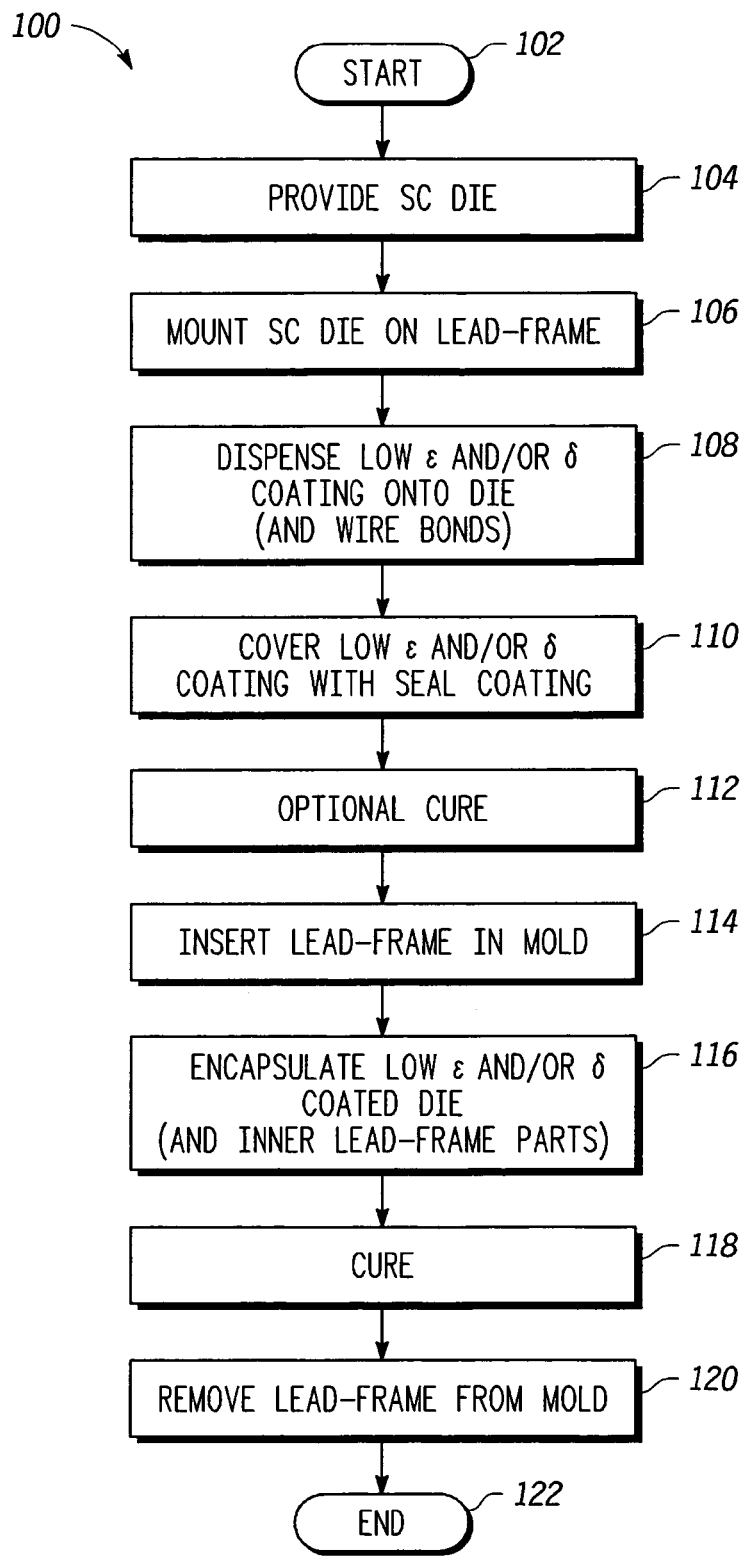
FIG. 8 shows a simplified flow chart illustrating a method according to a yet further embodiment of the present invention for forming a plastic encapsulated semiconductor (SC) device with lower package cross-talk and loss.

FIG. 8 show a simplified flow chart illustrating method 100 according to a yet further embodiment of the present invention for forming a plastic encapsulated semiconductor (SC) device with lower package cross-talk and/or loss, by providing buffer region 51, 61, 71, 81 in the immediate vicinity of SC die 42. Buffer region 51, 61, 71, 81 has a lower dielectric constant $\epsilon$ and/or lower loss tangent $\delta$ than surrounding encapsulation 47, that is, lower $\epsilon$ or lower $\epsilon$ or both, which requirement is indicated on FIG. 8 by the abbreviation "$\epsilon$ and/or $\delta$" indicating that at least one of $\epsilon$ or $\delta$ should be lower than that of encapsulation 47, or that both of $\epsilon$ and $\delta$ may be lower than that of encapsulation 47. Method 100 begins with START 102 and initial step 104 wherein one or more SC die 42 are provided. In step 106, die 42 are mounted on lead-frame 80 (as noted earlier, lead-frame 80 can be any type of support). In step 108, material having a lower dielectric constant $\epsilon$ or lower loss tangent $\delta$ or both relative to encapsulant 47 is dispensed onto die 42 and, optionally, also onto wirebonds 45, inner leads 48, etc. The lower $\epsilon$ and/or $\delta$ material may be any of the types described above or equivalents. In optional step 110 a seal coating (e.g., coating 62 of FIG. 4) may (or may not) be applied or formed depending upon the needs of the finished device. In optional step 112, buffer region 51, 61, 71, 81 (and optional sealing layer 62) is cured if needed. The curing treatment will vary depending upon the type of material chosen for buffer region 51, 61, 71, 81 (and optional sealing layer 62) and may include, for example and not intended to be limiting, a minimum elapsed time to allow a catalyzed resin to set up, or a heat treatment in the case of a thermosetting resin or a combination thereof or other cure process. Depending upon the combination of materials chosen, buffer region 51, 61, 71, 81 may be cured before sealing layer 62 is applied or both may be cured together or sealing layer 62 may be cured separately. Alternatively, buffer region 51, 61, 71, 81 (and/or any sealing layer 62) may be cured at the same time as encapsulation 47 in step 118, depending upon the materials that have been chosen by the user. Persons of skill in the art will understand how to specify an appropriate cure regime depending upon the particular materials they have chosen. Optional cure step 112 may be omitted or combined with any of following steps 114, 116 and/or 118, depending upon the cure required and the encapsulation conditions. In step 114, lead-frame 80 with buffer region 51, 61, 71, 81 applied is inserted into a mold (not shown) having cavities indicated, for example, by dashed outline 84 in FIG. 6 and in step 116, encapsulant 47 is applied over low $\epsilon$ and/or $\delta$ buffer region 51, 61, 71, 81 and the inner lead-frame parts not already covered by region 51, 61, 71, 81. In step 118, encapsulant 47 is appropriately cured using means well known in the art. In step 120, the encapsulated lead-frame is removed from the mold. Method 100 proceeds to END 122. Subsequent processing (e.g., trim, lead-form, test, etc.) is conventional.

According to a first embodiment, there is provided a semiconductor device, comprising, a supporting member, a semiconductor die mounted on a portion of the supporting member, a plastic encapsulation enclosing at least part of the supporting member and the die, and a buffer region located between the plastic encapsulation and the die, wherein the buffer region has a lower dielectric constant than the plastic encapsulation or a lower loss tangent than the plastic encapsulation or both. In a still further embodiment, the buffer region comprises hollow microspheres in a binder matrix. In a yet further embodiment, the hollow microspheres are hollow glass microspheres having sizes about ≦300 micrometers in diameter. In an additional embodiment, the buffer region has a relative dielectric constant about ≦3. In a yet still further embodiment, the buffer region has a loss tangent about ≦0.005.

According to a second embodiment, there is provided a plastic encapsulated semiconductor device, comprising, a semiconductor die having one or more bonding pads thereon, a plastic encapsulation surrounding one or more faces of the semiconductor die, and a buffer region located between the plastic encapsulation and the semiconductor die and including at least one of the one or more bonding pads, wherein the buffer region has a lower dielectric constant than the plastic encapsulation or a lower loss tangent than the plastic encapsulation or both. In a further embodiment, the buffer region is in contact with the one or more faces of the semiconductor die. In an additional embodiment, the buffer region includes a filler. In a still further embodiment, the filler comprises hollow microspheres less than about 300 micro-meters in diameter. In a still additional embodiment, the buffer region comprises a material having a dielectric constant less than or equal about 80% of the dielectric constant of the plastic encapsulation. In a yet still additional embodiment, the buffer region comprises a porous material. In a still yet further embodiment, the device further comprising a moisture sealing layer located between the buffer region and the plastic encapsulation According to a third embodiment, there is provided a method of encapsulating a semiconductor die, comprising, mounting the die on a lead-frame, covering a portion of the die with a buffer region of a first dielectric constant and first loss tangent, placing the lead-frame with the die and buffer region in a mold suitable for plastic encapsulation, wherein the die and buffer region are located in a cavity in the mold, and placing a plastic encapsulant in the cavity of the mold to substantially fill the cavity of the mold around the lead frame, die and buffer region with a plastic material of a second dielectric constant and a second loss tangent, wherein either the second dielectric constant is larger than the first dielectric constant or the second loss tangent is larger than the first loss tangent. In a further embodiment, the second dielectric constant is larger than the first dielectric constant and the second loss tangent is larger than the first loss tangent. In an additional embodiment, the method further comprises, after the covering step, at least partly curing the buffer region. In a still further embodiment, the covering step comprises covering a portion of the die with a buffer region material having a filler therein comprising hollow microspheres. In a yet further embodiment, the covering step comprises covering a portion of the die with a buffer region material having a first dielectric constant less than about 80% of the second dielectric constant. In a still yet further embodiment, the method comprises, between the covering step and the placing step, covering the buffer region with a sealing layer. In a still yet additional embodiment, the covering step comprises covering a portion of the die with a substantially organic material. In a yet still additional further embodiment, the covering step comprises, covering a portion of the die with a substantially inorganic material.

While at least one exemplary embodiment has been presented in the foregoing detailed description, it should be appreciated that a vast number of variations exist. For example, a wide variety of lower dielectric constant and/or lower loss tangent fillers and other materials may be used in conjunction with various resins as carriers and binders or by themselves. Persons of skill in the art will understand that the principals taught herein also apply to such variations. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method of encapsulating a semiconductor die, comprising:
    mounting the die on a lead-frame;
    adding particles of a filler to a resin, wherein the particles of the filler have a mix of filler sizes, and the particles of the filler are tightly packed within the resin;
    covering a portion of the die with a buffer region of a first dielectric constant and first loss tangent, wherein the buffer region includes the resin and the filler packed within the resin;
    placing the lead-frame with the die and buffer region in a mold suitable for plastic encapsulation, wherein the die and buffer region are located in a cavity in the mold; and
    placing a plastic encapsulant in the cavity of the mold to substantially fill the cavity of the mold around the lead frame, die and buffer region with a plastic material of a second dielectric constant and a second loss tangent, wherein at least the second dielectric constant is larger than the first dielectric constant or the second loss tangent is larger than the first loss tangent.

2. The method of claim 1, further comprising, after the step of covering the portion of the die, curing the buffer region.

3. The method of claim 1, wherein the step of covering the portion of the die comprises covering the portion of the die with a buffer region material having the filler therein comprising hollow microspheres.

4. The method of claim 3, wherein the step of covering the portion of the die comprises covering the portion of the die with a buffer region material having a first dielectric constant less than about 80% of the second dielectric constant.

5. The method of claim 1, further comprising, between the step of covering the portion of the die and the step of placing the plastic encapsulant in the cavity, covering the buffer region with a sealing layer.

6. The method of claim 1, wherein the step of covering the portion of the die comprises covering the portion of the die with a material that includes an organic material.

7. The method of claim 6, wherein the step of covering the portion of the die comprises covering the portion of the die with a material that includes an inorganic material.

8. The method of claim 1, wherein the step of covering the portion of the die comprises covering the portion of the die with a buffer region material having the filler therein comprising finely divided styrene.

9. The method of claim 1, wherein the step of covering the portion of the die comprises covering the portion of the die with a buffer region material having the filler therein comprising a plastic.

10. The method of claim 1, wherein the step of covering the portion of the die comprises covering the portion of the die with a buffer region material having the filler therein comprising glass fragments.

11. The method of claim 1, wherein the step of covering the portion of the die comprises covering the portion of the die with a buffer region material having the filler therein comprising ceramic fragments.

12. The method of claim 1, wherein the step of covering the portion of the die comprises covering the portion of the die with a buffer region material having the filler therein comprising filler having particles equal to 300 micro-meters or less.

* * * * *